Jan. 24, 1967 W. M. HENNESSEY 3,300,687

PACKAGE FOR AN ELECTRONIC MODULE

Filed May 7, 1965 2 Sheets-Sheet 1

INVENTOR.
WILLIAM M. HENNESSEY
BY Robert C. Green
ATTORNEY

Jan. 24, 1967 W. M. HENNESSEY 3,300,687

PACKAGE FOR AN ELECTRONIC MODULE

Filed May 7, 1965

2 Sheets-Sheet 2

INVENTOR.
WILLIAM M. HENNESSEY

BY Robert G. Green

ATTORNEY

United States Patent Office 3,300,687

Patented Jan. 24, 1967

3,300,687

PACKAGE FOR AN ELECTRONIC MODULE

William M. Hennessey, Roslyn, Pa., assignor to Burroughs Corporation, Detroit, Mich., a corporation of Michigan Filed May 7, 1965, Ser. No. 454,071

4 Claims. (Cl. 317—101)

This invention relates to electronic modules or packages and, particularly, to electronic modules which include tube sockets and printed circuit boards, and housings therefor.

There are many types of electronic modules in use at the present time which include a tube socket which is electrically and/or mechanically connected to one or more printed circuit boards, and the entire assembly is enclosed in a frame or housing of some kind. However, these known module constructions include a relatively large number of mechanical components to hold parts together and require a relatively large number of operations for assembly. These factors constitute a drawback in present day mass production operations.

In addition, generally, electronic modules of the type under consideration perform a single function and cannot be modified or utilized in simple fashion "in the field" to perform auxiliary functions.

Accordingly, the objects of the present invention concern the provision of an improved electronic module or package which utilizes a minimum number of mechanical components, requires no mechanical fasteners to hold parts together, and requires a minimum number of steps in assembly.

Another object of the invention concerns the provision of an improved electronic module of relatively simple construction and having the capability of performing a primary function and at least one auxiliary function.

Briefly, an electronic module embodying the invention includes a socket which is adapted to carry an indicator tube for displaying the function performed by the circuit carried by the module. The socket is also adapted to be electrically coupled to one or more printed circuit boards which also carry electronic components arranged in an operating circuit. The module of the invention also includes a frame or housing which is so constructed that it can enclose and support all of the elements of the module including the socket, printed circuit boards, various circuit lead wires, and the like, without auxiliary mechanical fasteners. Thus, the module can be assembled with a minimum number of assembly steps. The module of the invention is also designed to permit flexibility in the use of the electronic circuit components contained within the module. In particular, the module is constructed so that the electronic circuit contained therein can be operated as a unit or a portion thereof can be selected and operated as a sub-unit.

The invention is described in greater detail by reference to the drawing wherein.

Figures 1, 2, 5, 6:
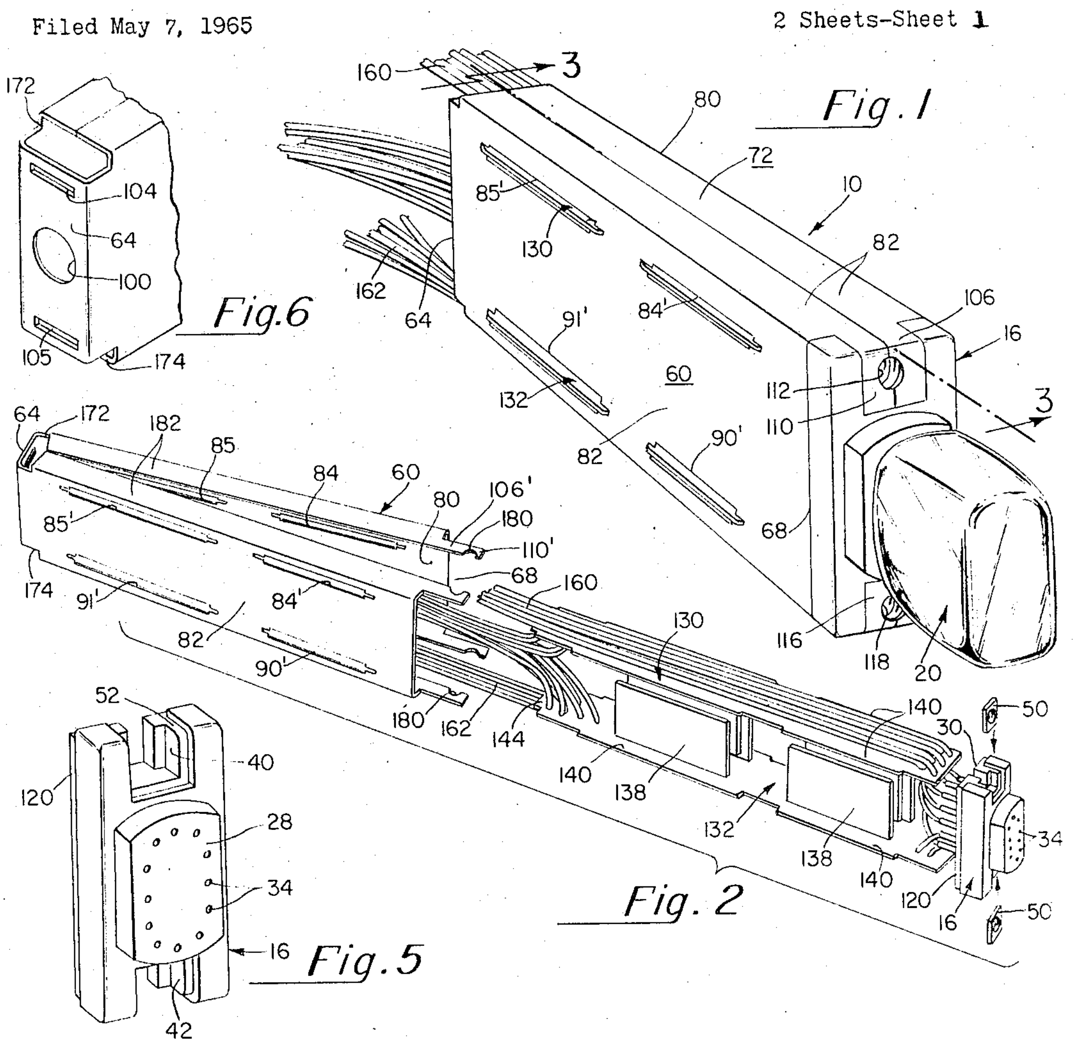
FIG. 1 is a perspective view of a module embodying the invention.
FIG. 2 is an exploded view of the module of FIG. 1 with the indicator tube removed.
FIG. 5 is a perspective view of a tube socket incorporated in the module of FIG. 1.
FIG. 6 is a perspective view of the rear end of a portion of the module of FIG. 1.

An electronic module 10 embodying the invention includes a socket 16 which is adapted to support an indicator tube, an electron tube, a semiconductor device, or the like. In the following description of the invention, it will be assumed that the module carries an electronic indicator tube such as a type 6844A gaseous cathode glow tube 20 which provides a visual display of the operation of the electronic circuit carried by the module. The socket includes a top or front surface 28 and a bottom or rear surface 30, and it carries the usual connectors 34 by which the tube 20 is supported on the top surface 28. The connectors 34 extend through the socket in known fashion and are accessible at the bottom surface 30 so that external electrical connection can be made to the various electrodes in the tube. The top or front surface of the socket is provided at opposite edges with chambers 40 and 42 (FIGS. 2 and 5), each of which is adapted to receive and support mechanical retaining or connecting means such as a nut 50. The nuts 50 are ultimately used to secure the module 10 to a panel or chassis in a manner to be described. A notch 52 is also formed in the opposite edges of the socket adjacent to and, in effect, surrounding each chamber for a purpose to be described.

The module or package 10 also includes a frame or housing 60, preferably of metal, which includes a closed rear end 64 and an open front end 68, a top wall 72, a bottom wall 74, and side walls 80 and 82. The socket 16 is fitted within the open front end 68 of the housing 60 and is secured to the housing in a manner to be described. The side wall 80 is provided with first upper elongated slots 84, 85 and second lower elongated slots 90, 91, with the members of each pair being aligned with each other parallel to the longitudinal axis of the housing. The second side wall 82 is provided with first upper elongated slots 84', 85' and second lower elongated slots 90', 91', with the members of each pair being aligned with each other parallel to the axis of the housing. The corresponding slots in the two side walls are also aligned with each other. The slots are provided for the purpose of supporting printed circuit boards in a manner to be described.

The rear end or back plate 64 of the housing 60 includes a central opening 100 to permit wires or the like to pass through, and upper and lower parallel horizontal slots 104, 105 for a purpose to be described.

The top wall 72 includes an arm 106 which extends forwardly from the central portion thereof and terminates in a vertical tab 110 which extends vertically downwardly therefrom. The tab 110 has an aperture 112. Similarly, the bottom wall includes arm 114 which extends from the central portion thereof and terminates in a vertical tab 116 which extends upwardly therefrom. The tab 116 has an aperture 118. The socket 16 is seated in the open end of the housing with the arms 106 and 114 seated in the notches 52 in the ends of the socket and with the tabs 110 and 116 overlying the nuts 50 in the chambers 40 and 42. The aperture in each tab is aligned with the aperture in the nut 50 associated therewith for a purpose to be described. Additionally, the wall of the frame which defines the open end of the housing bears against either the rear surface of the socket or a suitable notch or recess 120 formed in the side wall of the socket. With this arrangement of parts, the socket and housing are held together securely without requiring auxiliary fasteners.

The module 10 as shown is adapted to include two printed circuit boards, an upper board 130 and a lower board 132, which carry assorted electronic components 138 and are supported inside the housing 60 in a manner to be described. Of course, modifications may be made to accommodate more than two boards, if desired. The printed circuit boards 130 and 132 are thin and flat and are adapted to lie horizontally parallel to each other and to the longitudinal axis of the housing 60. The boards are provided with elongated lateral tabs or tongues 140 which permit the upper board to engage slots 84, 85 and 84', 85' in the side walls and the lower board to engage the aligned slots 90, 91 and 90', 91' in the side walls. In addition, the rear end 144 of each printed circuit board extends through and engages the apertures 104, 105 in the back plate 64 of the housing 60. Suitable electrical connections are made between the printed circuit boards and the tube connectors 34 which are accessible at the bottom surface of the socket 16.

In order to render the module 10 more flexible, means are provided to permit the indicator 20 to be coupled to another module or circuit external to module 10 with which it may also be used. To this end (FIGS. 2 and 3), a lead wire is secured to each connector and these wires are arranged in two convenient groups. One group 160 extends from the socket 16 along the top of the housing above the printed circuit board 130, and one group 162 extends along the bottom of the housing below the printed circuit board 132. The first group of wires 160 extends out of the housing at its rear end through a slot 172 formed in the top wall 72, and the groups of wires 162 similarly extends out of the housing through a slot 174 formed in the bottom wall 74.

It can be seen that the components of the circuit module 10 which include the socket 16, printed circuit boards 130 and 132, and housing 60 are held together in a single arrangement without requiring auxiliary fastening means such as nuts and bolts or the like. The simplicity of the module is further enhanced by the ease with which the housing 60 may be prepared from a single flat sheet of metal shown in FIG. 7.

Figures 7, 8, 9:
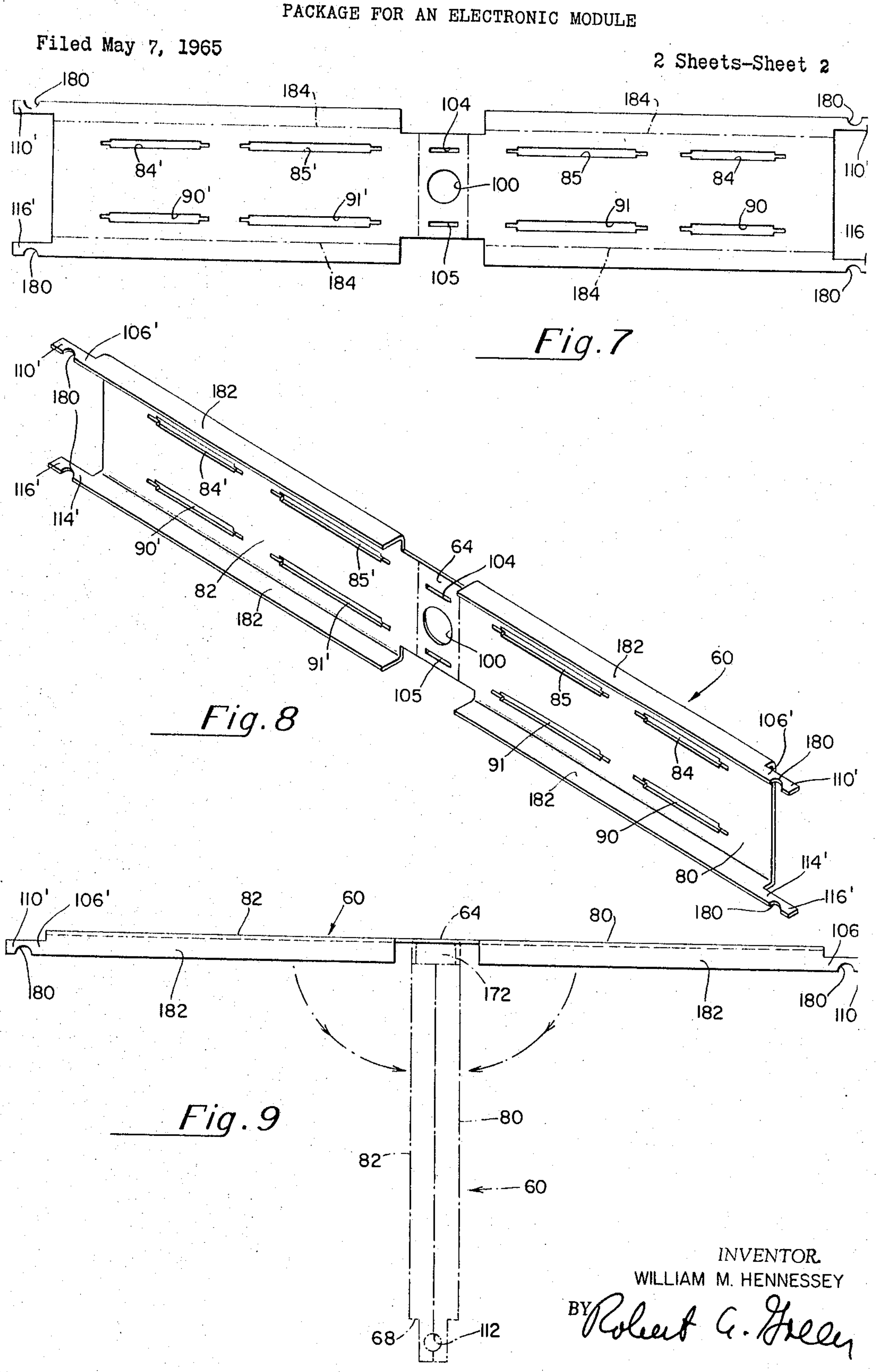
FIG. 7 is a plan view of a portion of the module of FIG. 1 at one stage in its preparation.
FIG. 8 is a perspective view of the article shown in FIG. 7 at a later stage in its preparation.
FIG. 9 is a top plan view of the article of FIG. 8 showing operations performed on it prior to its incorporation in the module of FIG. 1.

The metal sheet initially has the form shown in FIG. 7 with the base 64 and side walls 80 and 82 stamped out and with the side walls extending above and below the base. The portions 106' and 114' which become arms 106 and 114 and the portions 110' and 116' which become the tabs 110 and 116 comprise extensions of the upper and lower portions of the side walls. Each portion 110' and 116' includes a C-shaped notch 180 for a purpose to be described. These projecting edge portions are bent perpendicular to the main body of the flat sheet along the dash lines 184, as shown in FIGS. 8 and 9, to form flanges 182, and then the two side walls 80 and 82 are rotated toward each other, as shown in FIGS 2 and 9, to enclose the socket to which the printed circuit boards 130 and 132 are loosely coupled. As the side walls are brought together, the boards are properly positioned in the slots 84, 84' and 85, 85' in the side walls. When the side walls are brought together so that they are parallel to each other, the top and bottom flanges 182 which were bent over, meet to form the top and bottom walls 72 and 74, respectively, of the housing. Similarly, the arm portions 106' and 114' come together so that the semicircular notches 180 meet and form the circular apertures 112 and 118. The tabs 110 and 116 are finally bent over so that the circular apertures 112 and 118 are aligned with the threaded apertures in the nuts 50, as described above.

Figures 3, 4:
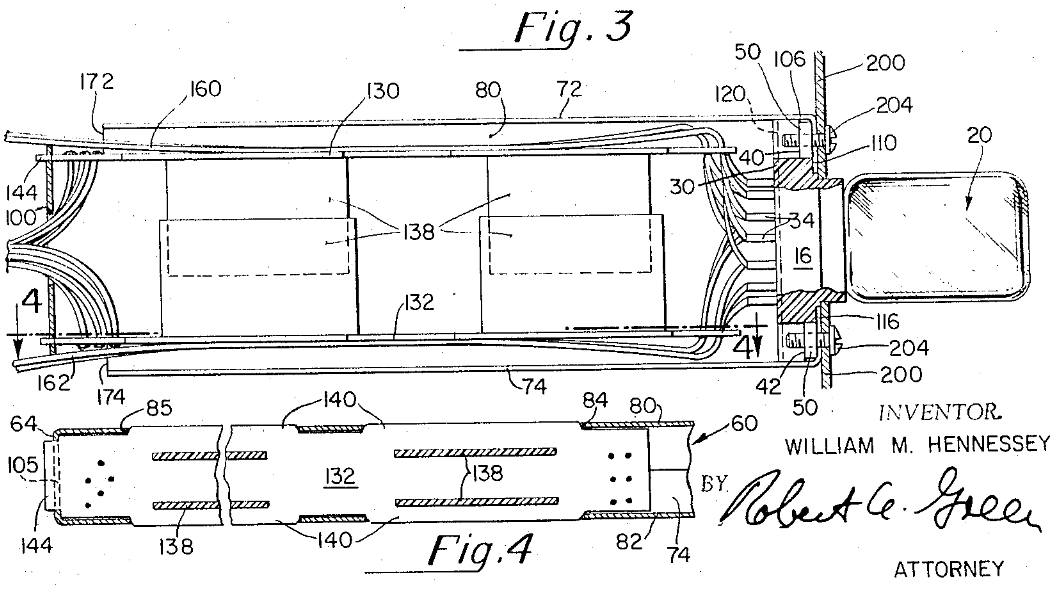
FIG. 3 is a sectional view along the lines 3—3 in FIG. 1.
FIG. 4 is a plan view, partly in section, of a portion of the module of FIG. 1.

The module 10 may be coupled together with other similar modules to form an instrument or the like, as is well known in the art. In such use, if desired, the module 10 may be mounted on a chassis or panel 200 as seen in FIG. 3 by inserting mounting bolts 204 through holes in the panel and through the apertures 112 and 118 in tabs 110 and 116 and into engagement with the nuts 50.

From the foregoing description, it can be seen that the electronic module of the invention is compact, is relatively simple in construction, and utilizes a minimum of component parts in its assembly. Also, the module has the advantage that the circuit components and indicator tube can be operated as a unit, and, in addition, the indicator tube may be connected separately to auxiliary circuits and can thus be operated independently of the circuit with which it is coupled in the module.

What is claimed is:

1. An electronic module including
   a socket for an electronic device,
   a plurality of thin, flat printed circuit boards each carrying a plurality of lead wires coupled thereto and extending along the length of each, each of said wires having one end secured to said socket whereby said boards are electrically conected to said socket but loosely mechanically coupled thereto, and
   a generally U-shaped metal housing having a rear wall and side walls, the side walls being adapted to be spread apart to receive said printed circuit boards between them and then brought together to form a closed, unitary housing, the free ends of the side walls remote from said rear wall including integral tabs which engage said socket and secure said socket and housing together as a unitary assembly,
   the side walls and rear walls of said housing having apertures in which portions of said boards are seated to hold them relatively rigidly in place inside said housing.
2. The module defined in claim 1 wherein
   said socket includes a pair of spaced-apart chambers with a retaining nut seated in each of said chambers,
   the tabs of said metal housing engaging and closing said chambers and holding said retaining nuts in place in said chambers whereby said retaining nuts are accessible for use in securing said housing to a support member by effecting a connection to said retaining nuts.
3. The module defined in claim 1 wherein said rear wall of said housing also includes an aperture through which the free end of said lead wires extend.
4. The module defined in claim 1 wherein
   said side walls are generally U-shaped and include top portions which combine to form a top wall for the housing and bottom portions which combine to form a bottom wall for the housing,
   said printed circuit boards are oriented parallel to each other, one being spaced from said top wall of said housing to provide a top space in said housing and the other being spaced from the bottom wall of said housing to provide a bottom space in said housing,
   selected one of said lead wires extending from said socket and lying in said top space and in said bottom space,
   said selected wires extending out of said housing through an aperture in said rear wall.

References Cited by the Examiner

UNITED STATES PATENTS

| | | | |
|---|---|---|---|
| 2,764,713 | 9/1956 | Alden | 317—101 |
| 2,864,977 | 12/1958 | Witt et al. | 317—101 |
| 2,885,603 | 5/1959 | Rose | 317—101 |
| 2,958,013 | 10/1960 | Ansley | 317—101 |
| 2,995,686 | 8/1961 | Selvin | 317—101 |

ROBERT K. SCHAEFER, *Primary Examiner.*

W. C. GARVERT, *Assistant Examiner.*